INTRODUCTION OF BARRIER IN GERMANIUM CRYSTALS

Filed May 26, 1958

INVENTORS
AARON L. KESTENBAUM &
SAMUEL W. DASKAM
BY J. L. Whittaker
ATTORNEY 2,978,367

INTRODUCTION OF BARRIER IN GERMANIUM CRYSTALS

Aaron L. Kestenbaum, Somerville, and Samuel W. Daskam, Readington Township, Hunterdon County, N.J., assignors to Radio Corporation of America, a corporation of Delaware Filed May 26, 1958, Ser. No. 737,843

5 Claims. (Cl. 148—1.5)

Figure 1:
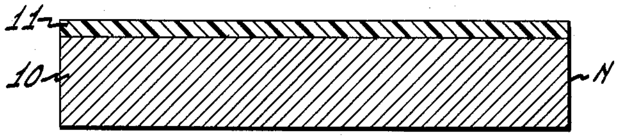

This invention relates to semiconductor devices. More particularly, it relates to improved junction-type devices and improved methods of introducing a rectifying barrier in a semiconductor wafer to make said devices.

Semiconductor devices are classified as either narrow-area or broad-area units. Narrow-area devices include those having a point or line rectifying contact to the semiconductor body. Broad-area or junction devices comprise a semiconductor body having at least one zone of P-type conductivity material and at least one zone of N-type conductivity material separated by a rectifying barrier known as a PN junction. Such devices are made by alloying an electrode pellet of one conductivity type to a semiconductor body of the opposite type, or by diffusing a given type impurity into an opposite type semi-conductor. The rectifying barriers thereby formed within the device exhibit asymmetrical electrical conductivity, inasmuch as they offer high resistance to electrical current flow in one direction and low resistance to such current flow in the reverse direction. Two-terminal devices comprising a single P-type region, a single N-type region, and a single PN junction between the two regions are used as rectifiers and are known as junction diodes.

A diode is said to be biased in the forward direction when a source of current such as a battery is applied so that the positive battery electrode is connected to the P-type region of the device and the negative battery electrode is connected to the N-type region. In this condition, a large current of negative charge carriers or electrons travels from the N-type region across the PN barrier to the P-type region, while simultaneously a large current of mobile electron vacancies or positive holes travels from the P-type region across the rectifying barrier to the N-type region of the device, and the resistivity of the device is low. Although the electrons and holes flow in opposite directions, they have opposite charge sign, and hence the total current crossing the junction is the sum of the electron and hole currents, which sum is the conventional current flowing in the direction of the holes from the P-type region to the N-type region.

The device is said to be biased in the reverse direction when the direction of the applied voltage is reversed so that the positive battery electrode is connected to the N-type region of the device and the negative battery electrode is connected to the P-type region. In this condition, the electrons have to flow from the P-type region, where they are the minority-type present, to the N-type region, where they are opposed by space charge effects. Similarly, the positive charge carriers or holes have to flow from the N-type region, where their concentration is low, to the P-type region, where their concentration is high and they are opposed by space charge effects. In each case, the flow soon reaches a limit as the applied potential increases to the point where all the available minority charge carriers have been drawn across the junction. The device is then said to be saturated, and the sum of the electron and hole current in this condition is known as the saturation current. Accordingly, the resistivity of the device is high in the reverse direction. The ratio of the forward current to the reverse current at the same applied potential, or the back resistance to the forward resistance, is one of the important diode parameters. The current ratio at one volt applied bias in both directions may be as high as $10^3$ and above in a good unit.

When a junction diode is connected in a circuit through which an alternating current flows at low or audio frequencies, the diode is an efficient rectifier. However, when the frequency of the circuit current increases, the efficiency and power-handling capability of the junction diode decreases. One factor in the decrease of rectifier efficiency is the transition capacitance of the junction, which gives rise to a displacement current. Rectifier efficiency also decreases because the charge carriers have a finite diffusion rate, and when the applied frequency is sufficiently high, the charge carriers have scarcely crossed the junction in the forward direction under the influence of one-half of the applied voltage cycle when they are forced to move back across the junction in the reverse direction by the other half of the cycle. The minority carriers which moved in the forward direction when the device was forward-biased have to be removed before the device can again block a current pulse in the reverse direction. These carriers are removed either by recombination with opposite charge carriers, or by collection at the electrodes of the device. The period of time required for the removal of the minority carriers is an important diode parameter, and is known as recovery time. In many circuit applications, such as computers, where it is necessary to pass a closely spaced group of pulses through a diode with a minimum of distortion, the recovery time of the device must necessarily be a very short period.

Accordingly, an object of this invention is the provision of improved electrical semiconductive devices.

Another object is the provision of improved high-speed junction diodes.

Still another object is an improved method of fabricating semiconductive devices.

Yet another object is an improved method of introducing a rectifying barrier into a semiconductor wafer.

But another object is an improved method of fabricating fast-acting junction diodes.

In general, the purposes and objects of this invention are accomplished by the provision of a semiconductor electrical device comprising a body of semiconductive material having therein a region of predetermined conductivity type or value, a region of a different conductivity type or value, and a rectifying barrier separating said regions, said semiconductive material being especially prepared with a small amount of nickel to give the device an extremely short recovery time. In accordance with a preferred embodiment of the invention, a rectifying barrier is introduced into a monocrystalline N-type semiconductor wafer by introducing sufficient nickel into the wafer to convert at least a portion of said wafer to P-type, and leaching sufficient nickel out of said portion of said wafer to reconvert said portion to N-type. The leaching step may be performed after the introduction of nickel into the wafer. In accordance with another aspect of the invention, the leaching step may be performed simultaneously with the introduction of nickel into the wafer.

The invention is described in greater detail by reference to the drawings, wherein:

Figures 1–6 are cross-sectional views of successive steps in the fabricaiton of a semiconductor device in accordance with the invention;

Figures 7*a*–7*d* are schematic graphic diagrams useful in explaining the formation of rectifying barriers in accordance with the invention.

Similar elements are designated by similar reference characters throughout the drawing.

In Figure 1 a semiconductor wafer 10 is shown which is prepared of monocrystalline germanium. The exact size of the wafer is not critical, as it is subsequently diced into smaller units. A convenient thickness for the wafer is about 6 mils. In this example, the wafer 10 is monocrystalline germanium about 200 mils square and 6 mils thick. The wafer should be of N-type conductivity. In this example, the wafer 10 contains sufficient antimony to be N-type and have a resistivity of about 2 to 20 ohm-centimeters. An inert non-conducting coating 11 is applied to one major surface of the wafer 10. The coating 11 may for example be a wax or a resin such as Kel–F 200.

Figure 2:
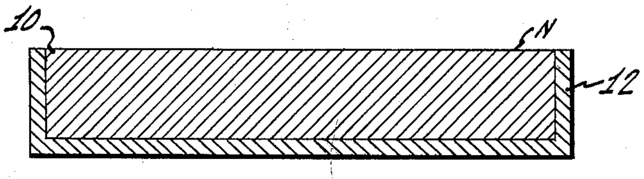

The unmasked surfaces of the wafer 10 are then covered with a nickel plating 12 as shown in Figure 2, and the wax coating 11 is removed with a suitable organic solvent such as acetone or blacosolve. The nickel coating may be applied by the electroless technique if desired. Alternatively, the nickel coating 12 may be electroplated by treating the wafer for one minute in a plating bath consisting of 40 ounces nickel chloride and 4 ounces boric acid per gallon of water. A satisfactory current density is about 25 to 100 amperes per square foot at 55° C. In this example, a current of 25 milliamperes is utilized for the nickel plating step.

Figure 3:
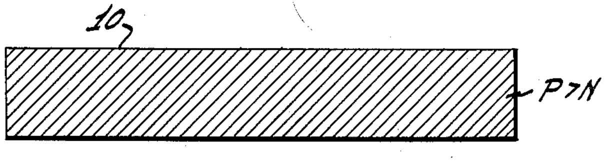
Figure 4:
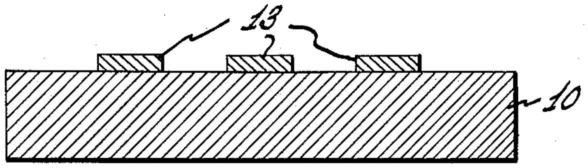

The next step is the diffusion of the plated nickel into the wafer. The wafer 10 is first dried in methanol and placed with the nickel-plated surface down in a graphite boat. The wafer is then heated to 850° C. and maintained at that temperature for about 10 minutes to diffuse nickel from the coating 12 through the entire wafer 10. The furnace ambient is preferably non-oxidizing in character, and may be an inert gas such as argon or a reducing atmosphere such as hydrogen. The wafer 10 is then quenched in the same ambient, cooled to room temperature, and etched for about 5 minutes to remove the remainder of the nickel coating 12. A suitable etchant for germanium wafers consists of 6 ml. concentrated nitric acid, 1 ml. concentrated hydrofluoric acid, 3 ml. glacial acetic acid, and 1 drop 20% potassium iodide solution. Since nickel is an acceptor in germanium, and the concentration of nickel-acceptor atoms in the wafer now exceeds the concentration of antimony-donor atoms originally present, the wafer 10 is converted to P-type conductivity as illustrated in Figure 3.

Sufficient nickel is then leached out of a portion of the wafer so that the leached portion is reconverted to N-type conductivity. In one embodiment shown in Figure 4, leaching is accomplished by alloying an electrode pellet to a wafer surface. Several electrode pellets 13 are positioned on one major face of the wafer 10, preferably the face which was not coated with nickel. The number of pellets used depends on the wafer area. The electrode pellets 13 may be spherules, discs, or slabs, since their exact size and shape is not critical. In this example, the pellets 13 are 16 mils long, 10 mils wide, and 5 mils thick. The pellets 13 are made of material which when molten is capable of acting as a sink for nickel, i.e., nickel is much more soluble in the molten electrode material than it is in the semiconductive wafer material. The pellet material must also be electrically conductive and capable of forming an ohmic connection to the semiconductor wafer. Furthermore, the pellet material must not act as a sink for the donor, which consists of antimony in this example. It has been found that lead, tin and lead-tin alloys are suitable electrode materials for this purpose. The pellets 13 are alloyed to the wafer 10 by heating the wafer-pellet assembly for 3 minutes at a temperature of 650° C., preferably in a hydrogen ambient.

Figure 5:
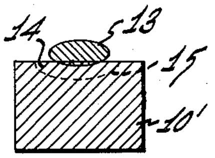

The wafer 10 is then broken into individual units such as 10' illustrated in Figure 5. Each unit 10' bears an alloyed electrode pellet 13. During the alloying, the nickel atoms in the wafer region 14 adjacent to the electrode 13 diffuse through the semiconductor into the molten pellet and dissolve therein. Sufficient nickel is thereby leached out of zone 14 to reconvert this region of the wafer 10 to N-type conductivity. A rectifying barrier or PN junction 15 is formed at the interface between the N-type zone 14 and the P-type bulk of the wafer.

Figure 6:
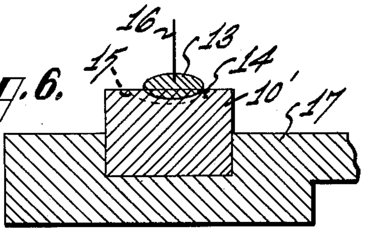

To complete the device as in Figure 6, a lead wire 16 is connected to the electrode pellet 13. An electric connection to the P-type bulk of the wafer is provided by soldering the wafer face opposite the electrode 13 to a metal base tab 17, which may for example be nickel. The unit is preferably etched after this step. Etching may be accomplished electrolytically by immersing the unit for one second in a potassium hydroxide solution while passing a 20 milliampere current in the forward direction through the device. A subsequent junction etch in acid has also been found helpful. A suitable etchant for this purpose is a solution of 2 volumes concentrated hydrofluoric acid, 2 volumes concentrated nitric acid and 1 volume of water. The unit is then encapsulated by conventional methods.

Figures 7A, 7B, 7C, 7D:
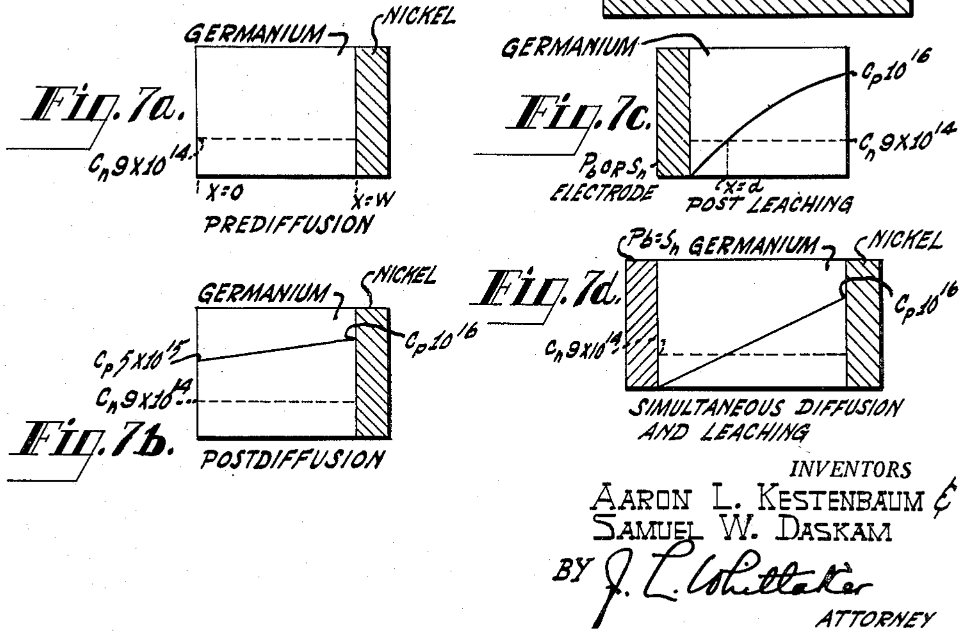

The method of forming PN junctions described above may be designated the leached junction method, and rectifying barriers made by this method will be referred to as leached junctions. The formation of leached junctions may be explained by reference to Figure 7. Figure 7*a* is a schematic diagram of the condition of the wafer in the pre-diffusion stage. The thickness of the wafer is $w$. The distance into the wafer or depth of leaching is $x$, and varies from zero at one major wafer face which is leached to $w$ at the opposite face, where the nickel coating has been deposited. The wafer is N-type at this stage, and has a uniform donor concentration $C_n$ of about $9\times10^{14}$ atoms per cc. throughout this thickness, as shown by the horizontal dashed line.

The post-diffusion stage of the wafer, after nickel has been diffused from the nickel plating throughout the wafer, is illustrated in Figure 7*b*. The concentration of nickel atoms throughout the wafer thickness varies from high at the face adjacent to the nickel plating to low at the opposite face, and is shown by the solid line. However, sufficient nickel is diffused into the wafer so that the acceptor concentration $C_p$ varies from about $10^{16}$ atoms per cc. adjacent to the nickel plating to about $5\times10^{15}$ atoms per cc. at the opposite face, i.e., the entire wafer is converted to P-type, since the acceptor concentration is in excess of the donor concentration throughout the wafer.

The post-leaching stage of the same wafer after the nickel coating has been removed and an electrode of lead or tin has been alloyed to the opposite wafer face is illustrated in Figure 7*c*. A portion of the nickel from the wafer region adjacent the lead or tin diffuses out of the wafer and dissolves in the electrode pellet. The amount of nickel leached is greatest nearest to the electrode pellet, and the leaching of nickel decreases with increasing distance from the electrode into the wafer. Although the electrode acts as a sink for the nickel, it does not have any appreciable effect on the donor impurities present, and hence the donor concentration remains substantially constant throughout the wafer. A portion of the wafer adjacent to the electrode has sufficient nickel removed so that the acceptor concentration in this portion falls below the donor concentration, and hence this portion of the wafer is reconverted to N-type. A PN junction is thereby formed at distance $x$ into the wafer equal to $d$, where $d$ is the depth at which sufficient nickel is leached so that the acceptor concentration, i.e., the concentration of nickel atoms remaining in the wafer after the leaching out process is equal to the donor concentration of the wafer. At depth $d$ the wafer is compensated. The portion of the wafer between $x=0$ and $x=d$ is reconverted to N-type, while the wafer portion between $x=d$ and $x=w$ remains P-type.

The leaching of an impurity such as nickel from a finite slab of semiconductive material such as germanium may be calculated by assuming that the initial impurity density is constant throughout the slab. It is also assumed that the molten electrode pellet is an infinite sink, so that the concentration of nickel in the semiconductor immediately adjacent the pellet is zero. The expression for the concentration of a leached impurity such as nickel as a function of distance, impurity diffusivity and time is:

$$C=\frac{4C_0}{\pi}\sum_{m=0}^{m=\infty}\left[e^{\frac{-(2m+1)^2\pi^2L^2}{4w^2}}+\sin\frac{(2m+1)\pi x}{2w}+\frac{1}{(2m+1)}\right]$$

where $x$=distance into the wafer
$C$=impurity concentration at distance $x$ into the wafer
$C_0$=initial concentration of the impurity at wafer surface which is leached. For example, in Figure 7*b* $C_0=5\times10^{15}$ atoms per cc.
$L$=diffusion length of the impurity, that is, the square root of D*t*, the product of the diffusion constant by the time in seconds
$w$=wafer thickness
$m$=the series of positive integers from 0 to infinity.

As an example of a specific calculation with this equation, the wafer used in the above example is a slab of N-type germanium 6 mils thick, and has a donor concentration $C_d$ of about $9\times10^{14}$ atoms per cc. The wafer is saturated with nickel by a diffusion process in which nickel is coated on one wafer face, and the coated wafer is heated to 850° C. The concentration of nickel in germanium thus obtained is $3.7\times10^{15}$ atoms per cc. The ratio of the donor concentration to the nickel concentration is $$\frac{9\times10^{14}}{3.7\times10^{15}}$$

equal to 0.24, indicating that the nickel atoms are present in sufficient excess over the donor atoms to convert the entire wafer to P-type. If the diffusion time is 10 minutes, the diffusion length L equals the square root of D*t*, where D is the diffusion constant of nickel in germanium, which is about $10^{-5}$ cm.$^2$ per second at 850° C., and *t* is the time in seconds. Hence L equals the square root of $$10^{-5}\frac{\text{cm.}^2}{\text{sec.}}\times10\text{ min.}\times60\frac{\text{sec.}}{\text{min.}}=7.74\times10^{-2}\text{ cm.}=30\text{ mils.}$$

This illustrates that for a germanium wafer of 6 mil thickness essentially an equilibrium concentration of nickel is approached throughout the wafer. As nickel is subsequently leached from the wafer for 3 minutes at 300° C., it can be calculated from the above leaching equation that compensation takes place at a distance of 0.2 mil into the wafer. The calculation assumes an extrapolated value for the diffusion constant of nickel at 300° C.

The recovery time of diodes fabricated as described above may be estimated as follows. In the N-type region, the recovery time will essentially be the transit time for holes, which is $$\frac{W^2}{2D_p}\text{ equal to }2.84\times10^{-9}\text{ sec.}$$

where W is the width of the N-type region or 0.2 mil, and $D_p$ is the diffusion constant of minority carriers or holes, which is 45 cm.$^2$/sec. in germanium. In the P-type region the recovery time will be determined by both the recombination rate of holes with electrons and the electron transit time $$\frac{W^2}{2D_n}$$

where D is the diffusion coefficient of minority carriers (electrons), which is 93 cm.$^2$/sec. in germanium. When the P-type region is 1.9 mils thick, the transit time is equal to $$\frac{25\times10^{-6}}{186}$$

or $1.3\times10^{-7}$ sec. Since these two processes are competing for the available electrons, the recovery time is determined by the sum of the reciprocals of the characteristic time of each process, i.e., $$\frac{1}{t_{\text{recovery}}}=\frac{1}{t_{\text{transit}}}+\frac{1}{t_{\text{recombination}}}$$

Assuming the hole lifetime is 0.1 μsecond, the recovery time calculated from the above equation is $5.6\times10^{-8}$ sec.

It will be understood that many variations and modifications of the above process and device may be made without departing from the spirit and scope of the invention. The dimensions, concentrations, temperatures, and resistivities mentioned above have been stated by way of example only, and not as a limitation. If desired, the electrode pellet in the above example may contain a small proportion of a donor such as arsenic to insure a good ohmic contact to the N-type region of the device, and good electron injection into the P-type region.

Practical junction diode devices made as described above exhibited a breakdown voltage of 85 to 90 volts, a reverse or saturation current of 90 to 130 μamperes at 10 volt reverse bias, and a recovery time of 0.2 μsecond. The forward-to-back current ratio of these units is about 2200 at 1 volt applied bias.

Another embodiment of the invention will now be described. In this embodiment the diffusion of nickel into one wafer face and the leaching of nickel out of the other wafer face are performed simultaneously in a single heating step. An N-type germanium wafer of about 2 ohm-centimeter resistivity is masked on one major face, plated with nickel on the opposite face, then washed in an organic solvent, for example Blacosolve, and dried in methanol as described above. Thereafter the wafer is placed in a graphite boat, with the nickel plated surface down. Pure lead electrode pellets are positioned on the unplated upper face of the wafer, and the wafer is heated to 850° C. in a furnace containing a non-oxidizing ambient such as forming gas. During this step nickel is simultaneously diffused into the wafer from the plated surface, and at the same time is leached out of the opposite surface of the wafer by the molten electrode pellets. Thereafter the wafer is quenched in air, etched for 5 minutes in the etchant described above to remove excess nickel and surface impurities, then broken into individual units which are mounted, etched and cased as described above.

This embodiment of the invention may be better understood by reference to Figure 7*d*, which illustrates the simultaneous diffusion and leaching process. An analogy to this procedure may be made by comparison to a heat flow problem in which a constant gradient is eventually established in a slab of material placed between a heat source and a heat sink. It will be noted that in this single-step embodiment the character of the rectifying junction produced differs from that formed by the two-stage embodiment previously described and illustrated in Figure 7*c*. In the single-step embodiment, the decline in the nickel concentration from one wafer face to the opposite face is almost linear, and the junction produced is less abrupt than in the two-stage embodiment.

The solution of the diffusion equation for the case of simultaneous diffusion-in and leaching-out of an impurity is $$C=C_0\left[\frac{x}{w}+\frac{2}{\pi}\sum_{n=1}^{n=\infty}\frac{(-1)^n}{n}\sin\frac{nx}{w}e^{\frac{-(n\pi^2)}{w}Dt}\right]$$

where $x$=distance into the wafer
$C$=impurity concentration at distance $x$ into the wafer
$C_0$=impurity concentration at distance $x$ equal to zero
$w$=wafer thickness
$n$=the series of positive integers from $n=1$ to $n=\infty$
$D$=diffusion constant of the impurity in the semiconductor
$t$=time in seconds of combined diffusion and leaching out of the impurity When D$t$ is considerably larger than $w^2$, the solution approaches $$C=C_0\frac{x}{w}$$

i.e., the solution approaches the equation for a straight line ($y=mx$). For a more complete discussion of the diffusion equations, see R. M. Barrer, "Diffusion in And Through Solids," Cambridge University Press, pp. 14–15. By adjusting the different parameters such as $C_0$, the initial nickel concentration, which may be done by changing the diffusion temperature, or by adjusting the initial donor density, or by altering the wafer thickness, a wide variety of structures can be fabricated.

An example of the parameters in the single-step embodiment of the invention will be given. When the diffusion temperature is 850° C., the nickel concentration is $1.7\times10^{15}$ atoms per cc. at the wafer surface adjacent the nickel. If the N-type germanium wafer is 2 mils thick, and exhibits a resistivity of 10 ohm-centimeters with an initial donor concentration of $1.7\times10^{14}$ atoms per cc.$^3$, then the N-type region formed by simultaneous diffusion and leaching of nickel is equal to one-tenth the wafer thickness or 0.2 mil. Since the resistivity of the P-type region, injection will take place primarily by holes into the thin N-type region, thus producing a diode with excellent fast-recovery characteristics.

Practical junction diode units made by the above single-step process exhibited a reverse or saturation current of 10 to 20 $\mu$amperes at 20 volts reverse bias, and a recovery time of 0.24 to 0.32 $\mu$second. The quality of these units may be seen by noting that the resistance in the reverse direction is in the order of megohms, while the resistance in the forward direction at 1 volt bias is about 1 to 10 ohms. Units with a forward-to-back current ratio of 20,000 at 1 volt applied bias are easily obtained.

Although the embodiments described above related to the use of N-type wafers and the formation of PN junctions, it will be understood that this was by way of example only, and not as a limitation. The invention is equally applicable to P-type wafers so as to fabricate devices containing regions of the same conductivity type but different conductivity value, thereby introducing PP+ junctions in the wafers.

There have thus been described improved methods of introducing a rectifying barrier in a semiconductive wafer, and improved devices made by the method.

What is claimed is:

1. The method of fabricating a leached PN junction in an N-conductivity type germanium wafer comprising diffusing sufficient nickel into one surface of said wafer to convert at least a portion thereof to P-type, and simultaneously alloying to the opposite surface of said wafer a pellet of material selected from the group consisting of lead, tin, and lead-tin alloys, said pellet leaching sufficient nickel out of the wafer region adjacent said pellet to leave said region N-conductivity type.

2. The method of fabricating a leached PN junction in an N-conductivity type germanium wafer, comprising plating nickel on one major surface of said wafer, contacting to the opposite surface of said wafer a pellet of material selected from the group consisting of lead, tin, and lead-tin alloys, heating said pellet and wafer so as to diffuse sufficient nickel from said plating into said one surface of said wafer to convert at least a portion thereof to P-conductivity type while simultaneously alloying said pellet to said wafer, said pellet leaching nickel out of the wafer region adjacent said pellet to leave said region N-conductivity type.

3. The method of making a fast-acting diode comprising the steps of nickel plating one major face of an N-conductivity type germanium wafer, contacting to the opposite major wafer face a pellet of material selected from the group consisting of lead, tin, and lead-tin alloys, heating said pellet and wafer so as to diffuse sufficient nickel from said plating into said wafer to convert at least a portion thereof to P-conductivity type, simultaneously alloying said pellet to said wafer, said pellet leaching part of said diffused nickel out of the wafer region adjacent said pellet to leave said region N-conductivity type, and ohmically attaching one connecting wire to said pellet and another connecting wire to said opposite wafer face.

4. The method of making a quick-recovery diode comprising the steps of nickel plating one wafer face of an N-conductivity type germanium wafer having a resistivity of about 2 to 20 ohm centimeters, heating said wafer in a hydrogen atmosphere for about 10 minutes at about 850° C. so as to diffuse sufficient nickel into said wafer to convert said wafer to P-conductivity type, quenching said wafer by rapid cooling in air to room temperature, contacting a tin pellet to one major wafer face, heating said pellet and wafer in a hydrogen atmosphere for about 3 minutes at about 650° C. so as to alloy said pellet to said wafer and leach part of said diffused nickel out of the region of said wafer adjacent to said pellet, thereby reconverting said adjacent region to N-conductivity type, and ohmically attaching one connecting wire to said pellet and another connecting wire to said wafer.

5. The method of making a high-speed diode comprising the steps of nickel plating one major face of an N-conductivity type germanium wafer having a resistivity of about 2 to 20 ohm centimeters, contacting a lead pellet to the opposite major face, heating said pellet and said wafer in a forming gas atmosphere for about 10 minutes at about 850° C. so as to simultaneously diffuse nickel into said wafer from said plating while alloying said pellet to said wafer, said pellet thereby leaching part of said diffused nickel out of the region of said wafer adjacent to said pellet so as to leave said adjacent region N-conductivity type, quenching said wafer by rapid cooling in air to room temperature, and ohmically attaching one connecting wire to said pellet and another connecting wire to said opposite wafer face.

References Cited in the file of this patent

UNITED STATES PATENTS

| | | |
|---|---|---|
| 2,725,315 | Fuller | Nov. 29, 1955 |
| 2,774,695 | Burton | Dec. 18, 1956 |
| 2,813,233 | Shockley | Nov. 12, 1957 |
| 2,827,436 | Bemski | Mar. 18, 1958 |
| 2,836,523 | Fuller | May 27, 1958 |
| 2,845,374 | Jones | July 29, 1958 |
| 2,846,346 | Bradley | Aug. 5, 1958 |

UNITED STATES PATENT OFFICE
CERTIFICATE OF CORRECTION

Patent No. 2,978,367 April 4, 1961

Aaron L. Kestenbaum et al.

It is hereby certified that error appears in the above numbered patent requiring correction and that the said Letters Patent should read as corrected below.

Column 2, line 70, for "fabricaiton" read -- fabrication --; column 7, line 41, after "P-type" insert -- region is on the average less than that of the N-type --.

Signed and sealed this 23rd day of January 1962.

(SEAL)
Attest:

ERNEST W. SWIDER
Attesting Officer

DAVID L. LADD
Commissioner of Patents